US006765823B1

(12) United States Patent
Zhu et al.

(10) Patent No.: US 6,765,823 B1
(45) Date of Patent: Jul. 20, 2004

(54) MAGNETIC MEMORY CELL WITH SHAPE ANISOTROPY

(75) Inventors: Theodore Zhu, Mission Viejo, CA (US); Yong Lu, Rosemount, MN (US); Anthony Arrott, Washington, DC (US); Joel Drewes, Boise, ID (US)

(73) Assignee: Micron Technology Incorporated, Boise, ID (US)

( * ) Notice: Subject to any disclaimer, the term of this patent is extended or adjusted under 35 U.S.C. 154(b) by 0 days.

(21) Appl. No.: 10/354,251

(22) Filed: Jan. 29, 2003

(51) Int. Cl.⁷ .............................................. G11C 11/15
(52) U.S. Cl. ..................... 365/173; 365/171; 365/51; 365/158
(58) Field of Search .............................. 365/173, 171, 365/158, 51, 225.5

(56) References Cited

U.S. PATENT DOCUMENTS

| | | | | |
|---|---|---|---|---|
| 5,734,605 A | * | 3/1998 | Zhu et al. | 365/173 |
| 5,828,598 A | | 10/1998 | Chen et al. | 365/158 |
| 5,841,692 A | | 11/1998 | Gallagher et al. | 365/173 |
| 5,966,012 A | | 10/1999 | Parkin | 324/252 |
| 6,028,786 A | * | 2/2000 | Nishimura | 365/173 |
| 6,166,948 A | | 12/2000 | Parkin et al. | 365/173 |
| 6,172,904 B1 | | 1/2001 | Anthony et al. | 365/173 |
| 6,205,053 B1 | * | 3/2001 | Anthony | 365/173 |
| 6,646,910 B2 | * | 11/2003 | Bloomquist et al. | 365/158 |
| 6,689,622 B1 | * | 2/2004 | Drewes | 438/3 |

OTHER PUBLICATIONS

Dimitrov et al., "Enhanced magnetic stability in spin valves with synthetic antiferromagnet" *Journal of Applied Physics* 87(9):6427–6429 (May 2000).
Leal and Kryder, "Spin Valves biased by Co/Ru/Co Synthetic antiferromagnets" *Journal of Applied Physics* 83(7):3720–3723 (Apr. 1998).

* cited by examiner

*Primary Examiner*—Andrew Q. Tran
(74) *Attorney, Agent, or Firm*—Knobbe Martens Olson & Bear, LLP

(57) ABSTRACT

A magneto-resistive memory comprising magneto-resistive memory cells is disclosed, comprising a pinned magnetic layer and a free magnetic layer. The two magnetic layers are formed having widened regions at the ends of the layers. As such, the shape made out by the magneto-resistive memory, from a top-view perspective, is wide at the ends and narrower at the mid-, forming an I shape in one preferred embodiment. The end portions of the free magnetic layer are allowed to magnetically couple to the end portions of the pinned magnetic layer such that magnetic coupling is shifted to these widened regions and coupling in the mid-portion between the widened regions is minimized. Thus, the influence of the pinned magnetic layer on the magnetization orientation of the mid-portion of the free magnetic layer is substantially eliminated, allowing for increased predictability in switching behavior and increased write selectivity of memory cells.

47 Claims, 11 Drawing Sheets

MAGNETIC MEMORY CELL WITH SHAPE ANISOTROPY

FIELD OF THE INVENTION

The present invention relates to magneto-resistive memories, and more particularly, to magneto-resistive memory cell structures that offer superior selectivity of memory cells.

BACKGROUND OF THE INVENTION

As computer memory technology advances, magneto-resistive memory has emerged as a possible replacement for conventional memory devices. Magneto-resistive memories are non-volatile and employ the magneto-resistive effect to store memory states. These memories typically use the magnetization orientation of a layer of magneto-resistive material to represent and to store a binary state. For example, magnetization orientation in one direction may be defined as a logic "0", while magnetization orientation in another direction may be defined as a logic "1".

The ability to read stored binary states is a consequence of the magneto-resistive effect. This effect is characterized by a change in resistance of multiple layers of magneto-resistive material, depending on the relative magnetization orientations of the layers. Thus, a magneto-resistive memory cell typically has two magnetic layers that may change orientation with respect to one another. Where the directions of the magnetization vectors point in the same direction, the layers are said to be in a parallel orientation and where the magnetization vectors point in opposite directions, the layers are said to be oriented anti-parallel. In practice, typically one layer, the "free" or "soft" magnetic layer, is allowed to change orientation, while the other layer, commonly called the "fixed," "pinned" or "hard" magnetic layer, has a fixed magnetization orientation to provide a reference for the orientation of the free magnetic layer. The magnetization orientation of the two layers may then be detected by determining the relative electrical resistance of the memory cell. If the magnetization orientation of its magnetic layers are substantially parallel, a memory cell is typically in a low resistance state. In contrast, if the magnetization orientation of its magnetic layers is substantially anti-parallel, the memory cell is typically in a high resistance state. Thus, ideally, in typical magneto-resistive memories, binary logic states are stored as binary magnetization orientations in magneto-resistive materials and are read as the binary resistance states of the magneto-resistive memory cells containing the magneto-resistive materials.

Giant magneto-resistive (GMR) and tunneling magneto-resistive (TMR) memory cells are two common types of memory cells that take advantage of this resistance behavior. In GMR cells, the flow of electrons through a conductor situated between a free magnetic layer and a pinned magnetic layer is made to vary, depending on the relative magnetization orientations of the magnetic layers on either side of the conductor. By switching the magnetization orientation of the free magnetic layer, the electron flow through the conductor is altered and the effective resistance of the conductor is changed.

In TMR cells, an electrical barrier layer, rather than a conductor, is situated between a free magnetic layer and a pinned magnetic layer. Electrical charges quantum mechanically tunnel through the barrier layer. Due to the spin dependent nature of the tunneling, the extent of electrical charges passing through the barrier vary with the relative magnetization orientations of the two magnetic layers on either side of the barrier. Thus, the measured resistance of the TMR cell may be switched by switching the magnetization orientation of the free magnetic layer.

Switching the relative magnetization orientations of the magneto-resistive materials in the memory cell by applying an external magnetic field is the method commonly used to write a logic state to a magneto-resistive memory cell. The magnitude of the applied magnetic field is typically sufficient to switch the magnetization orientation of the free magnetic layer, but not large enough to switch the pinned magnetic layer. Thus, depending on the desired logic state, an appropriately aligned magnetic field is applied to switch the magnetization orientation of the free magnetic layer so that the magneto-resistive memory cell is in either a high or a low resistance state.

Magneto-resistive memory cells are typically part of an array of similar cells and the selection of a particular cell for writing is usually facilitated by use of a grid of conductors. Thus, magneto-resistive memory cells are usually located at the intersections of at least two conductors. A magneto-resistive memory cell is typically selected for writing by applying electrical currents to two conductors that intersect at the selected magneto-resistive memory cell. With current flowing through it, each conductor generates a magnetic field and, typically, only the selected magneto-resistive memory cell receives two magnetic fields, one from each conductor. The current flowing through both conductors is such that the net magnetic field from the combination of both these magnetic fields is sufficient to switch the magnetization orientation of the selected cells. Other magneto-resistive memory cells in contact with a particular conductor usually receive only the magnetic field generated by that particular conductor. Thus, the magnitudes of the magnetic fields generated by each line are usually chosen to be high enough so that the combination of both fields switches the logic state of a selected magneto-resistive memory cell but low enough so that the other magneto-resistive memory cells subject to only one magnetic field do not switch.

In addition to the two conductors for writing, memory arrays with three conductors connecting magneto-resistive memory cells have also been developed. The additional conductor may be used exclusively for sensing the resistance of a particular memory cell, allowing another conductor to be used exclusively for writing. In this way, writing and reading operations may be performed simultaneously, increasing the speed of data access. Furthermore, the third conductor can also be employed to supply an additional magnetic field during switching operations.

Magneto-resistive memory technology continues to mature and work continues in refining implementation of magneto-resistive memory cells.

SUMMARY OF THE INVENTION

The preferred embodiments of the present invention provide magneto-resistive memory cell structures which minimize disruptions to the magnetization orientation of the free magnetic layer caused by interactions with pinned magnetic layer magnetic fields. In a preferred embodiment, looking at a top-view of the memory cell, a magneto-resistive memory cell is formed with two widened end-portions on either side of a thinner mid-portion. The two widened end-portions may each be of different dimensions and may abut the mid-portion at different angles, so long as the widened end-portions maintain a width greater than their length. In another embodiment, the mid-portion is centered along the width of the two portions, forming an I shape with the end portions. In other embodiments, the mid-portion is not centered along the width of the two end-portions.

As a consequence of the presence of the widened end-portions, the mid-portion is substantially free of magnetic coupling. Thus, the magnitude of an applied magnetic field used to switch a magnetization orientation of the free magnetic layer in one direction is substantially equal to the magnitude of an applied magnetic field used to switch the magnetization orientation of the free magnetic layer in a substantially opposite direction.

Other features and advantages of the present invention will become apparent from the following detailed description, taken in conjunction with the accompanying drawings, illustrating by way of example the teachings of the invention.

DETAILED DESCRIPTION OF THE PREFERRED EMBODIMENT

To reliably store a state using magneto-resistive memory, it is desirable to have predictability in switching behavior. As such, it is desirable to have a magneto-resistive memory cell that will switch to a high resistance state by application of a magnetic field of a predicable magnitude and that will also switch to a low resistance state by application of a magnetic field of a predictable magnitude in the opposite direction. Moreover, predictability in switching behavior associated with a particular applied magnetic field will improve the ability to select a particular magneto-resistive memory cell in a magneto-resistive memory cell array. Unfortunately, interactions between the pinned and free magnetic layers of prior magneto-resistive memory cells may contribute to unpredictability in switching and, thus, undermine the ability to selectively switch cells.

While this invention is not limited by theory, the interactions between pinned and free magnetic layers may be conceptualized in terms of thermodynamic principals. It is generally understood that a given system will tend to assume a configuration which minimizes the free energy of the system. Thus, in the case of magneto-resistive memory cell, the lowest energy arrangement for a given system of magnetic layers is the most stable and the most likely to occur.

Magneto-resistive memory cells typically have well-defined edges. Consequently, the magnetic layers comprising these magneto-resistive memory cells typically also terminate in an abrupt edge. In one theoretical model, uncompensated magnetic poles may be thought of as occurring long these abrupt edges.

Figure 1A:
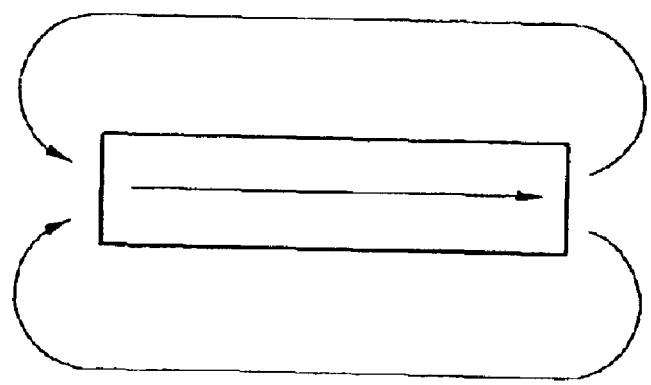
FIG. 1a is a schematic side-view of a cross-section of a magnetic material, with arrows indicating, in simplied form, the magnetization orientation of that material and magnetic lines of the demagnetization field created by that material.

In cases of a magnetic material without other magnetic materials nearby, the uncompensated poles create a so-called B field, or demagnetization field, which opposes another magnetic field created by the alignment of the uncompensated poles within the magnetic material. As such, the orientation of the demagnetization field is essentially anti-parallel to the alignment of the uncompensated poles. Oriented this way, the demagnetization field thus creates the closed magnetic flux loop that necessarily exists with all magnetic materials. This model of the demagnetization field is represented in FIG. 1a.

Figure 1B:
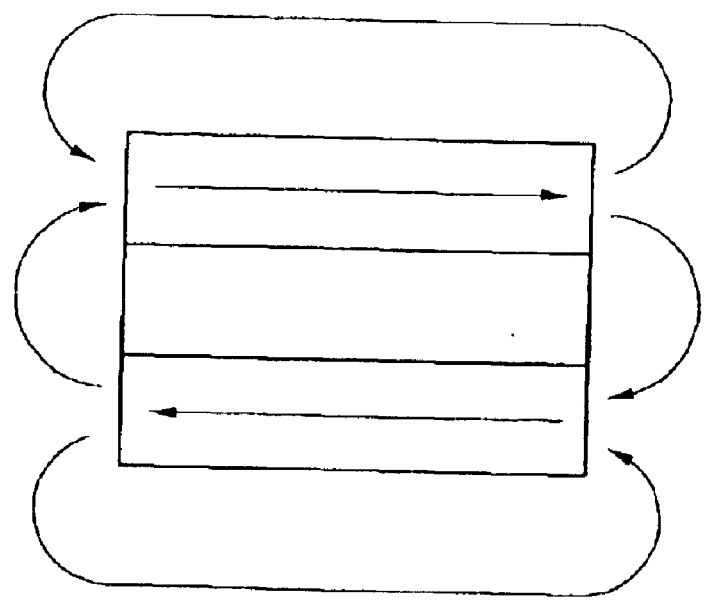
FIG. 1b is a schematic side-view of a cross-section of two layers of a magnetic material separated by a non-magnetic material, with arrows indicating, in simplied from, the magnetization orientation of that material and the magnetic lines of the demagnetization fields created by those layers of materials.

In other cases where one magnetic layer is in close proximity with another magnetic layer, the two magnetic layers can interact to create the closed loop of magnetic flux discussed above. Each magnetic layer generates a demagnetization field that tends to force the magnetization orientation of the other layer into an anti-parallel orientation. The resulting anti-parallel magnetization orientations allow the two magnetic layers to create a closed magnetic flux loop, as shown in FIG. 1b. This arrangement of anti-parallel magnetic layers is thermodynamically favored because it minimizes the free energy of the system. In cases where the two magnetic layers are the free and fixed layers of magneto-resistive cells, it is thought that the tendency of closely arranged magnetic layers to align in an anti-parallel orientation causes assymetries in switching behavior, as discussed below.

Figure 2:
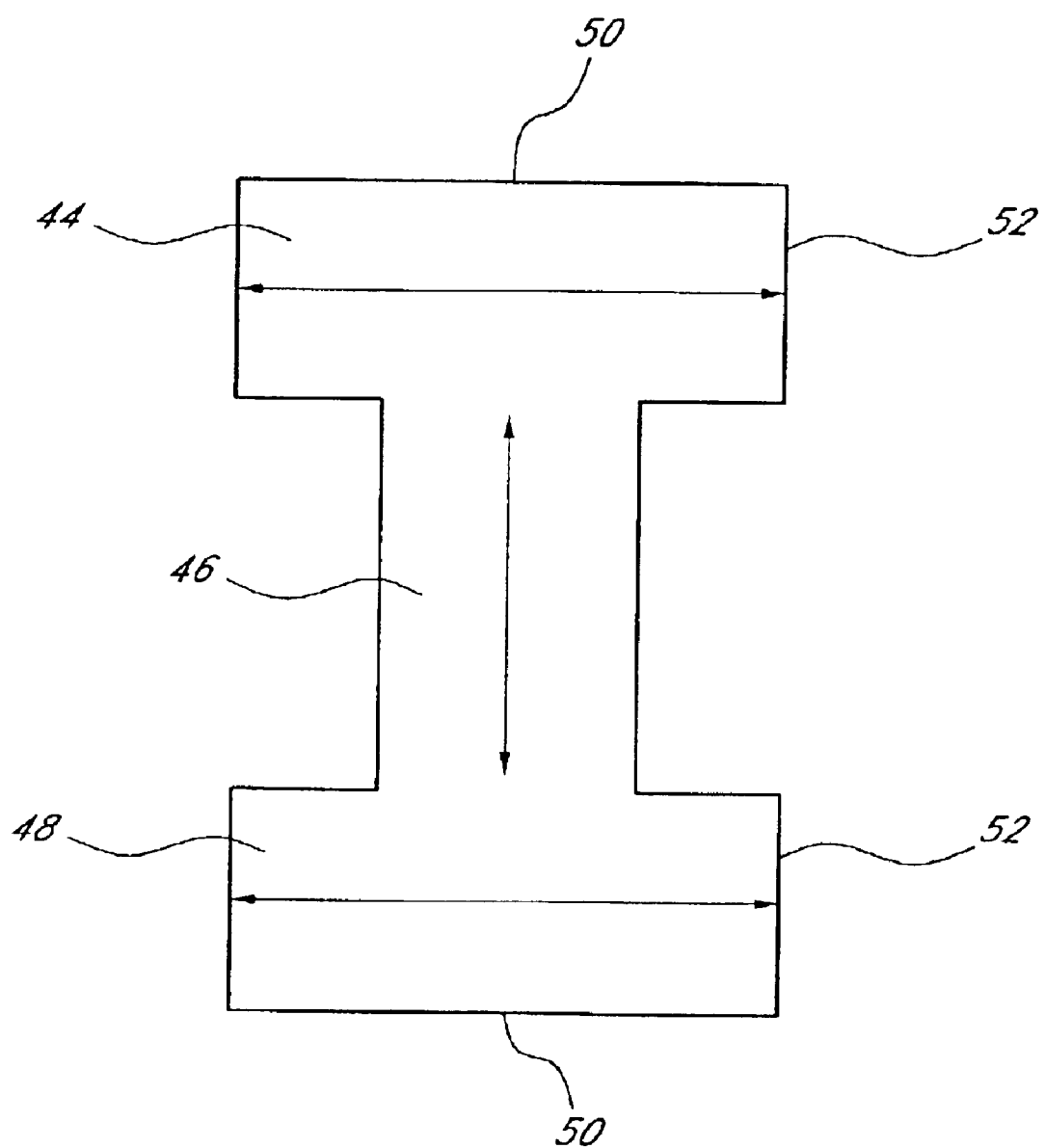
FIG. 2 is a schematic top-view of possible magnetization orientations of three portion of a magneto-resistive memory cell construed in accordance with preferred embodiment of the present invention.

As noted above, the orientation of a demagnetization field is governed by the alignment of the uncompensated poles of the magnetic material. Also, as noted above, these uncompensated poles occur at the edges of the magnetic layers. It has been found, in addition, that the alignment of these uncompensated poles is related to the shape of the magnetic material. A magnetic layer with an elongated shape has shape anisotropy; that is, where a magnetic layer has one axis longer than another axis, magnetic moments will preferentially align along the long axis. As shown in FIG. 2, where a material is shaped having multiple long axis, the magnetic moments of the magnetic material along each long axis will align along that axis. This is because it is energetically favorable for these uncompensated poles to be minimized and to be as far as possible from one another. In essence, shape anistropy caused the uncompensated poles to occur along the short axis of an elongated shape, resulting in the closed magnetic flux loop illustrated in FIGS. 1a and 1b.

Thus, where the free and pinned layers of a magneto-resistive memory cell are rectangularly shaped (from a top- and side-view perspective), the uncompensated poles align as described above and the demagnetization fields of the pinned and the free magnetic layers align along the long axis of a magneto-resistive memory cell, as illustrated in FIG. 1b. Moreover, to minimize the free energy of the system comprising the two magnetic layers, the free and pinned magnetic layers orient with anti-parrallel magnetization orientations to create a closed magnetic flux loop. In such an arrangement, the magnetization fields may be said to be coupled due to the influence of their respective demagnetization fields.

Figure 3:
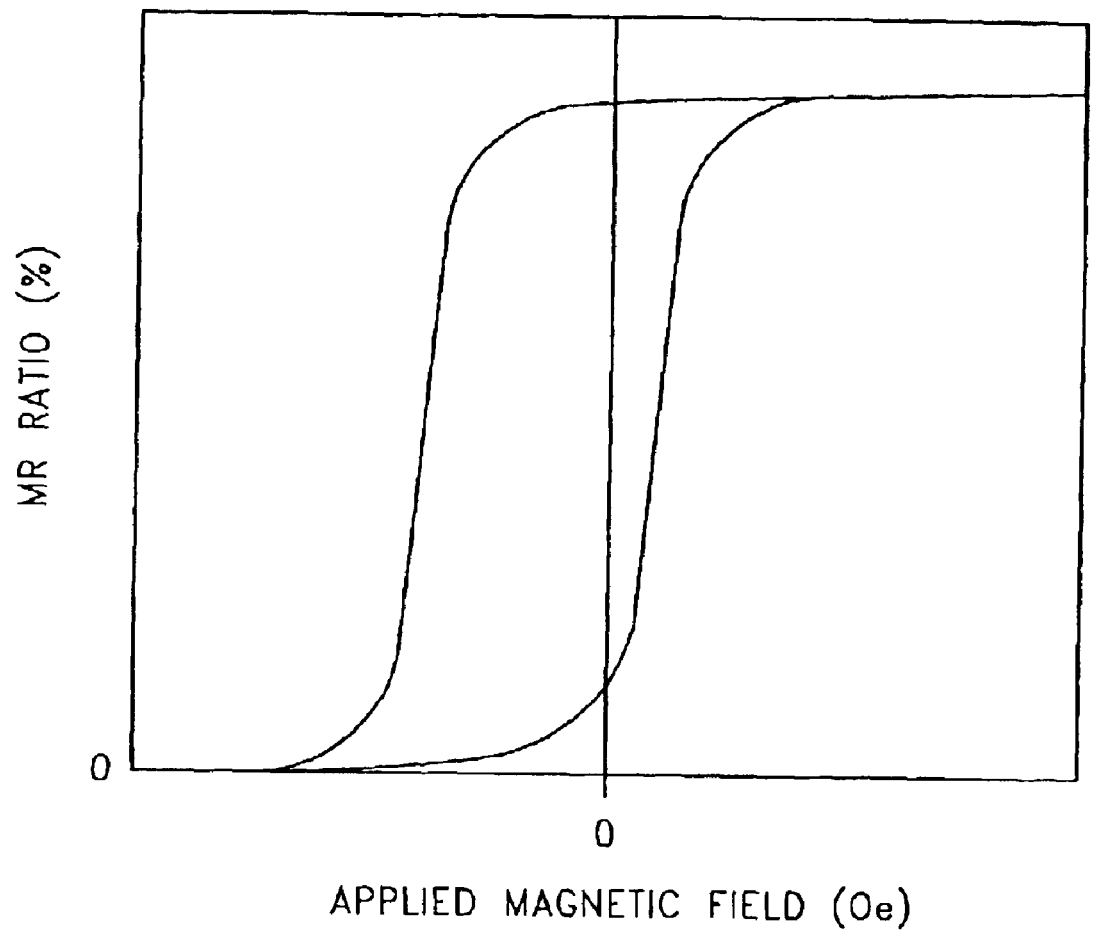
FIG. 3 is a generalized representation of the magneto-resistive behavior of a conventional magneto-resistive memory cell.

Thus, where such coupling occurs, an applied magnetic field must overcome the influence of this coupling to switch a free magnetic layer to the parallel orientation, while the demagnetization fields will augment a magnetic field applied to switch the same free magnetic layer to the anti-parallel orientation. Thus, as represented in FIG. 3, the magnitude of the applied magnetic field needed to switch the free magnetic layer to the low resistance state is increased while the magnitude of the applied magnetic field needed to switch the free magnetic layer to the high resistance state is decreased. As a consequence, coupling due to demagnetization fields typically increase the current needed to write the magneto-resistive memory cell to the low resistance state and may cause accidental writing to the high resistance state. In extreme cases, the applied magnetic fields may be insufficient to overcome the demagnetization fields and the free magnetic layer may remain in the anti-parallel orientation.

In less extreme cases, where the coupling is strong, but where an applied magnetic field is able to switch the magnetization orientation of the free magnetic layer, the coupling between the free and fixed magnetic layers may still be sufficient to cause the magnetization orientation of the free layer to switch back to its previous orientation. In such cases, depending on the strength of the coupling, the orientation of the free layer may switch spontaneously, undermining the ability of the cell to be used as a nonvolatile memory device.

Similarly, interactions between the magnetic layer of one magneto-resistive memory cell and the magnetic layers of neighboring magneto-resistive memory cells may cause demagnetization of those neighboring memory cells. For example, demagnetization fields originating from the pinned magnetic layer of one magneto-resistive memory cell may interact with and alter the magnetization orientation of the free layer of another memory cell. Moreover, these demagnetization fields may augment a magnetic field applied to switch the free magnetic layer to one magnetization orientation, while resisting switching to the opposite magnetization orientation. Such interactions are of particular concern as work continues on decreasing the distance between memory cells to increase the memory cell density of magneto-resistive memory cell arrays.

U.S. Pat. No. 6,172,904 discloses one possible structure for addressing the problem of unpredictable switching behavior caused by coupling between the pinned magnetic layer and the free magnetic layer within a particular memory cell. That patent describes a structure, illustrated in FIG. 4 of that patent, with a free magnetic layer 4 between two pinned magnetic layers, 6 and 34, with anti-parallel magnetization orientations M1 and M4. The pinned layers 6 and 34 couple to the free magnetic layer 4. Thus, coupling to one pinned layer 6 forces the magnetization orientation M3 of the free magnetic layer 4 in one direction. However, because the structure contains another pinned layer 34 with an opposite magnetization orientation M4 and a magnetic field of the same magnitude, the second pinned layer 34 also couples to the free magnetic layer 4. Each pinned magnetic layer 6 and 34 affects the free magnetic layer 4 in an equal and opposite way, resulting in no net tendency to push the magnetization orientation M3 of the free magnetic layer 4 in any particular direction.

As discussed earlier, pinned and free magnetic layers tend to couple along their long axis such that their magnetization orientations are anti-parallel. The preferred embodiments of the present invention takes advantage of this effect to increase predictability in switching behavior. In particular, the illustrated embodiments utilize two elongated, or widened, sections that are perpendicular and at opposite ends of a magneto-resistive memory cell.

Figure 4:
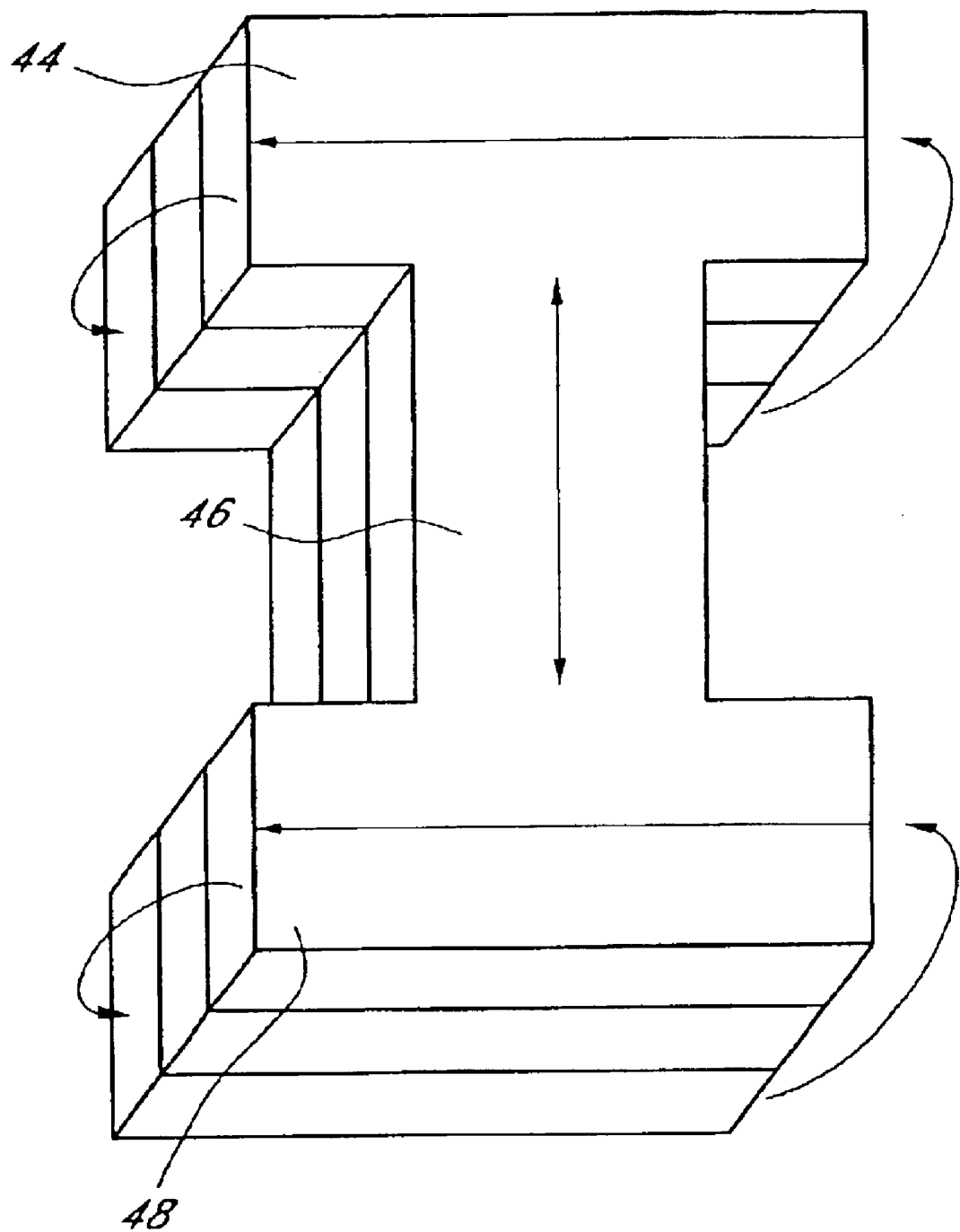
FIG. 4 is an isometric schematic view of a magneto-resistive memory cell construed in accordance with preferred embodiments of the present invention, with arrows indicating, in simplied form, possible magnetization orientations of that material and the magnetic lines of the demagnetization fields created by those layers of materials.

Without being limited by theoretical models, such a structure may be thought of as accomplishing several purposes. First, because the magnetization orientation of a magnetic material will align along the long axis of the shape made out by that material, three alignments will result: each widened end-portion 44 and 48 will align along its respective long axis and the mid-portion 46 will align along its own long axis (FIG. 2). Second, widening the end-portions 44 and 48 shifts the location of uncompensated poles. Because uncompensated poles tend to occur along the short axis of an elongated shape, the location of the uncompensated poles will be shifted from the now widened ends 50 of the magneto-resistive memory cell to the shorter ends 52 of the elongated end-portions. Ideally, the demagnetization field generated by the uncompensated poles will align along the long axis of the widened end-portions 44 and 48, rather than the long axis of the memory cell as a whole. Thus, coupling will occur principally between a widened end-portion 44 or 48 of a pinned magnetic layer that is immediately above or below another corresponding widened end-portion 44 or 48 of a free magnetic layer (FIG. 4). Consequently, in one embodiment where the magneto-resistive memory cell is in the general shape of an I, the coupled widened end-portions 44 and 48 will have magnetic alignments substantially perpendicular to the magnetization orientation of the mid-portion 46. As such, the demagnetization fields do not augment or resist a magnetic field applied for switching the magnetization orientation of the free layer. Thus, magnetic coupling and the influence of demagnetization fields is shifted to the widened end-portions 44 and 48, leaving the mid-portion 46 of the free layer relatively free to switch magnetization orientations. It will be appreciated that the magnetization orientations shown in FIG. 4 are illustrative only; the magnetization orientations of any of portions 44, 46 or 48, together or separately, may be reversed from that shown.

Figure 5:
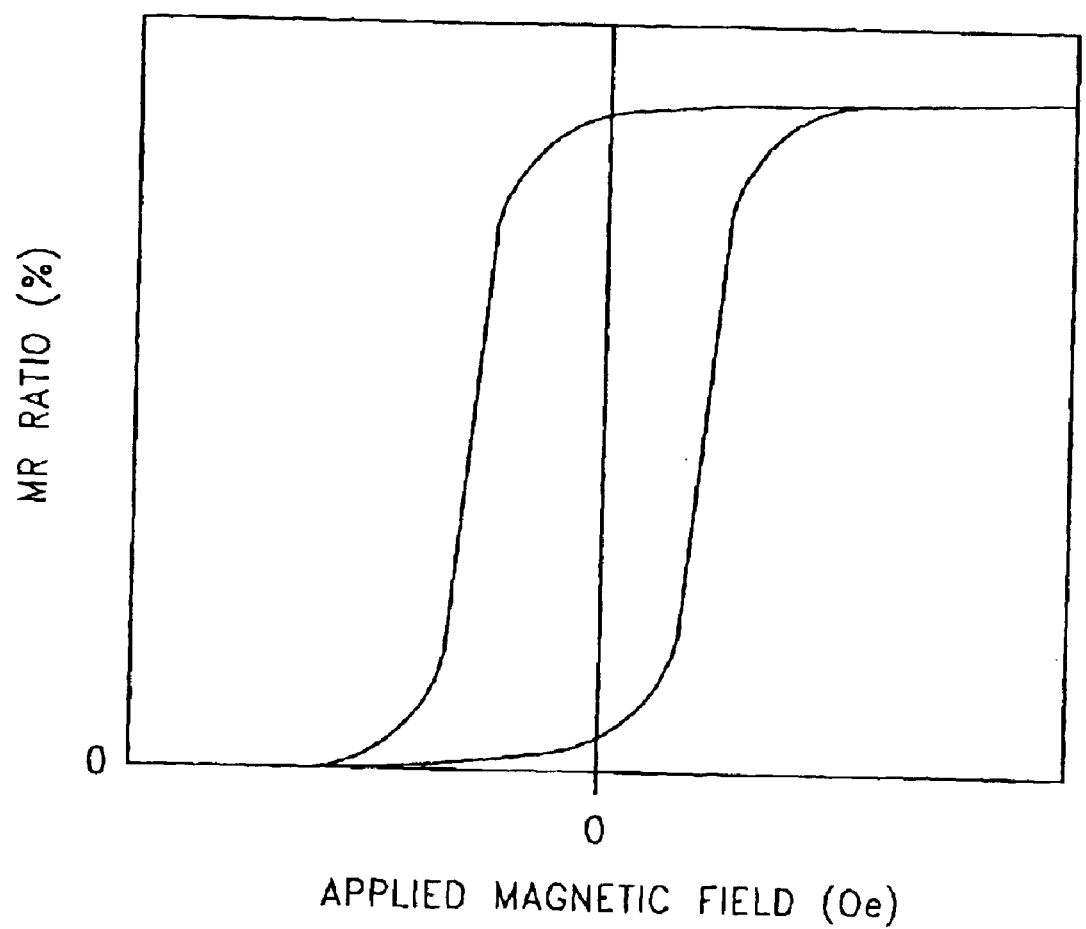
FIG. 5 is a representation of the magneto-resistive behavior of a magneto-resistive memory cell construed in accordance with preferred embodiments of the present invention.

Thus, the preferred embodiments of the present invention take advantage of the interactions between the elongated ends of the free and pinned magnetic layers to increase predictability in switching behavior. As represented in FIG. 5, the interactions between the two magnetic layers allow for switching behavior in which the magnitudes of the applied magnetic fields used to switch a magneto-resistive memory cell from a low resistance state to a high resistance state, and vice versa, may be made substantially equal. Because of this magneto-resistive behavior, the magnitudes of the current used to write a logic "0" or "1" are also substantially equal, and switching predictability is increased.

In that case, it may be said that the switching magnitude difference is close to zero. The switching magnitude difference is the difference in the magnitudes of the applied magnetic fields used to switch a memory cell opposite states, i.e., the switching magnitude difference is equal to the magnitude of the applied magnetic field used to switch a memory cell from a low resistance state to the high resistance state minus the magnitude of the applied magnetic field used to switch a memory cell from a high resistance state to a low resistance state. Thus, in comparison to an identical magneto-resistive memory cell without widened end-portions (i.e., a memory cell that is identical in all aspects to a memory cell formed according to the present invention, except that the identical magneto-resistive memory cell does not have widened end-portions with the dimensions taught by the present invention), the switching magnitude difference for the magneto-resistive memory cell of the present invention will be closer to zero than the switching magnitude difference for the identical magneto-resistive memory cell.

In one preferred embodiment a first magnitude of an applied magnetic field used to switch a magneto-resistive memory cell from a low resistance state to a high resistance state is about 80–120 percent of a second magnitude of a second applied magnetic field used to switch a magneto-resistive memory cell from a high resistance state to a low resistance state. More preferably the first magnitude is about 85–115 percent of the second magnitude. Most preferably, the first magnitude is better than about 90–110 percent of the second magnitude. The dimensions are most preferably selected to result in the first and second magnitudes being substantially equal.

Figure 6:
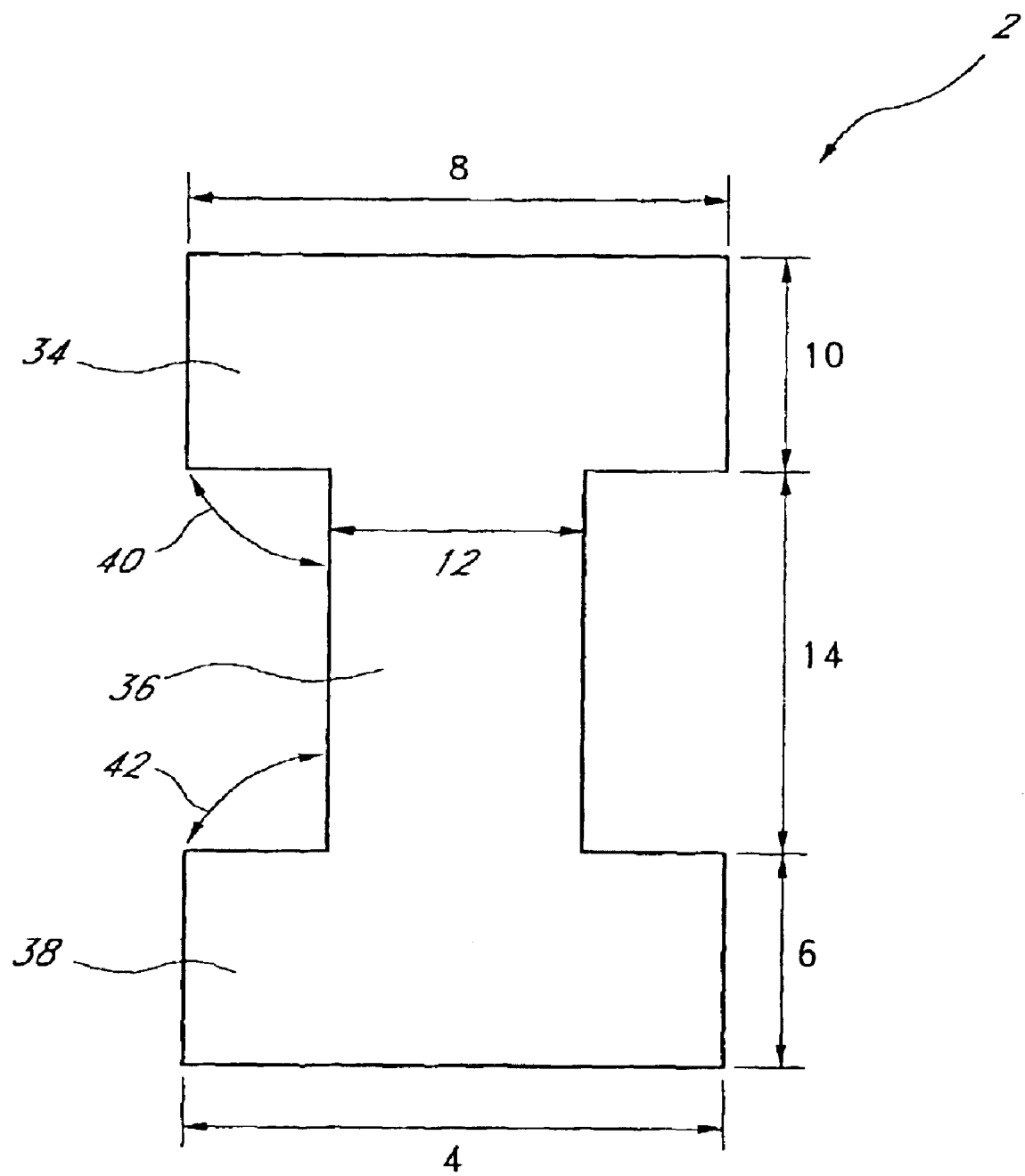
FIG. 6 is a schematic top-view of a memory cell in accordance with one illustration embodiment of the present invention.

Reference will now be made to FIGS. 6–11 wherein like numerals refer to like parts throughout. FIG. 6 is a top view of one illustrative embodiment of the invention. A magneto-resistive memory cell 2 forms a shape with three portions: one mid-portion and two widened end-portions at opposite ends of the mid-portion. A first widened end-portion 34 has a width 8 and a length 10. A second widened end-portion 38 has a width 4 and a length 6. A mid-portion 36 has a width 12 and a length 14. Note that while magneto-resistive memory cell 2 is described as comprising three portions, 34, 36, and 38, this division into parts is for ease of description only, as the memory cell 2 is preferably formed as a single unit.

The dimensions of the memory cell 2 are not limited by theory. Theory does not limit the maximum size of mid-portion 36, nor the maximum size of widened end-portions 34 and 38. The goal of increasing memory cell density, however, provides a practical limitation on the sizes of these memory cells; it will be appreciated that smaller absolute dimensions allow for higher memory cell densities and are, thus, generally preferred. As to theoretical minimums, the end-portions 34 and 38 generally will couple when the widths 8 and 4 are longer than the lengths 10 and 6, repectively. To account for manufacturing imprecision and other limitations, however, the widths 8 and 4 are preferably longer than the lengths 10 and 6, respectively, by some nominal amounts, as discussed below.

Thus, in one preferred embodiment of the invention, mid-portion 36 is centered along the widths 8 and 4 of widened end-portions 34 and 38. Preferably, mid-portion 36 and end-portions 34 and 38 are rectangular in shape, so that the three portions generally form the shape of an I. To facilitate magnetic coupling at the end-portions, the width 8 of widened end-portion 34 is preferably at least about 1.5 times longer than the length 10 of the end-portion 34. More preferably, the width 8 of end-portion 34 is at least about 2 times longer than the length 10. Most preferably, the width 8 of end-portion 34 is at least about 3 times longer than the length 10 of the end-portion 34. Similarly, the width 4 of end-portion 38 is preferably at least about 1.5 times longer than the length 6. More preferably width 4 is at least about 2 times longer than length 6, and most preferably width 4 is at least about 3 times longer than length 6.

Preferably, the width 8 is at least about 1.5 times longer than the width 12 of the mid-portion 36. More preferably the width 8 is at least about 2 times longer than the width 12. Similarly, the width 4 is at least about 1.5 times longer than the width 12 and more preferably the width 4 is at least about 2 times longer than the width 12.

Preferably, the dimensions of the end-portions 34 and 38 are substantially equal; that is, the width 8 and the length 10 of the end-portion 34 are substantially equal to the width 4 and the length 6 of the end-portion 38, respectively.

To facilitate proper alignment of the magnetizaton orientation of mid-portion 36 perpendicular to the magnetic alignment of the widened end-portions 34 and 36, the length 14 is preferably at least about about 1.5 times longer than the width 12. More preferably, the length 14 is at least about 2 times longer than the width 12 and most preferably at least about 3 times longer than the width 12.

It will be appreciated that the above-mentioned relationships between various dimensions of a magneto-resistive memory cell according to the present invention may be represented as ratios between two relevant dimensions. For example, in an embodiment where the width 8 is about 1.5 times longer than the width 10, it may be said that the ratio of the width 8 to the length 10 is 1.5:1.

The skilled artisan will appreciate that while the present teachings indicate particular relationships between the various dimensions of the widened end-portions 34 and 36 and the mid-portion 36, these teachings do not demand that the edges of the cells be straight. Thus, ellipsoids or other elongated shapes are also contemplated for widened end-portions 34 and 36.

Figure 7:
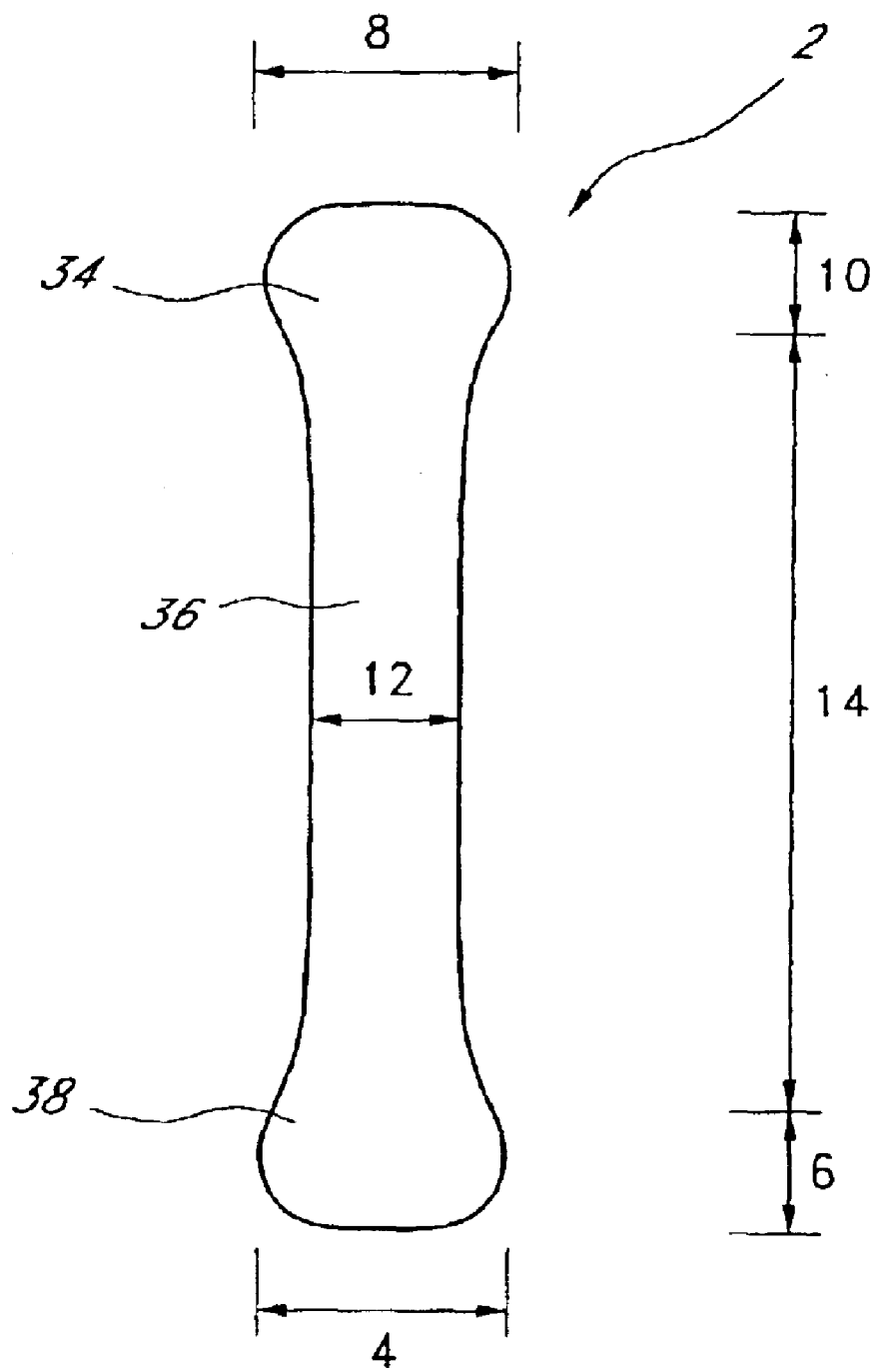
FIG. 7 is a schematic top-view of a memory cell in accordance with another illustrative embodiment of the present invention.

In actuality, limitations in the manufacture of magneto-resistive memory cells may prevent the formation of perfectly straight edges, as illustrated in FIG. 7. Rather than forming an I shape, magneto-resistive memory cell 2 may have a so-called dog bone shape and still conform to the present teachings. In particular, the end-portion 34 still has a width 8, measured at its widest expanse, and a length 10, measured from the end of the shape to where the shape begins to narrow. End-portion 38 similarly has a length 6 and a width 4. Also, mid-portion 36 still has a length 14, measured as the distance between the termination of length 10 and the termination of length 6, and a width 12, measured at the midpoint of length 14. It will be appreciated that the preferred dimensions remain as discussed above with respect to FIG. 6.

Figure 8:
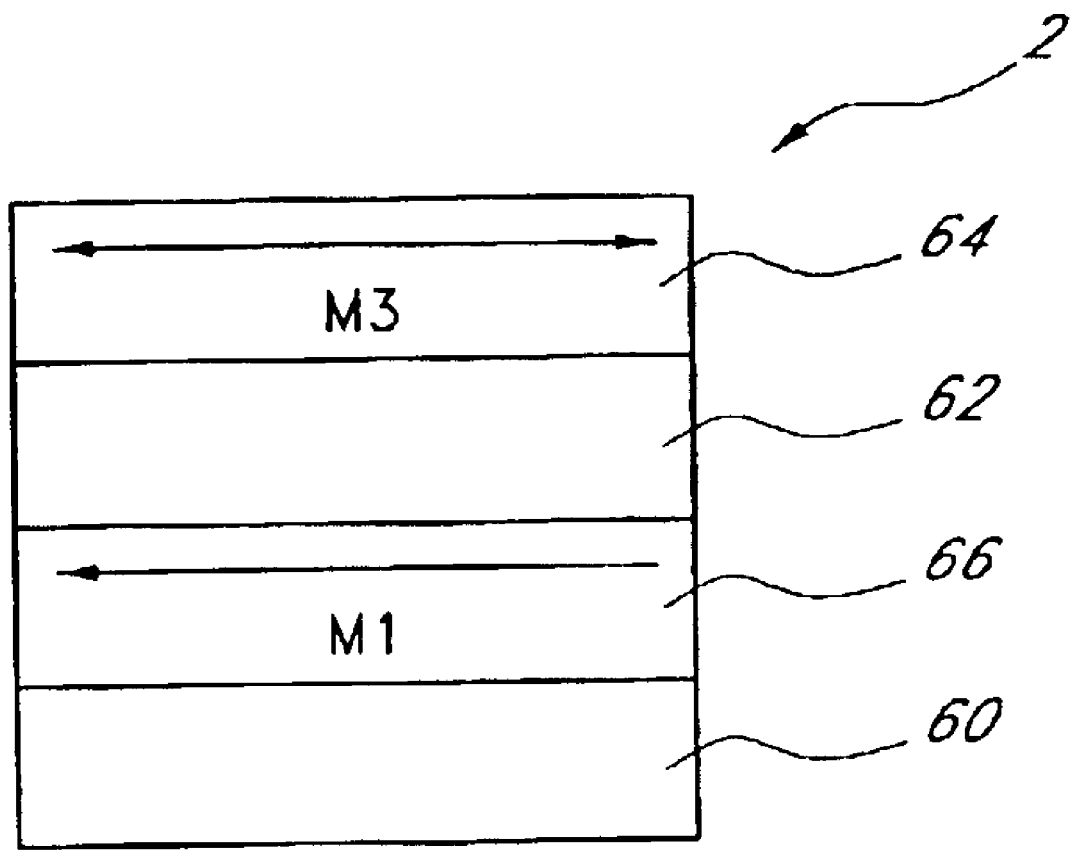
FIG. 8 is a schematic side view of a memory cell in accordance with one illustrative embodiment of the present invention.

FIG. 8 is a side view of an illustrative embodiment of the present invetion. The magneto-resistive memory cell 2 comprises a free magnetic layer 64 and a pinned magnetic layer 66. The free magnetic layer 64 has switchable magnetization orientation M3 and the pinned magnetic layer 66 has a fixed magnetization orientation M1. The pinned magnetic layer 66 is preferably comprised of a ferromagnetic material, including cobalt, iron-cobalt, nickel iron, nickel-iron-cobalt, or similar material. The magnetization orientation of the pinned magnetic layer 66 is preferably fixed by an adjacent layer 60 of antiferromagnetic material, in contact with and located directly below the pinned magnetic layer 66. The antiferromagnetic material may be iron-manganese, nickel-manganese, iridium-manganese, platinum-manganese, or similar material.

In another embodiment, the magnetization orientation of the pinned magnetic layer 66 is fixed by an adjacent layer 60 comprising a permanent magnet material.

In yet another embodiment, the pinned magnetic layer 66 is comprised of a permanent. magnet, the orientation of which may be fixed by exposure to a large external magnetic field. As such, in this embodiment, there is no layer 60 since the magneto-resistive memory cell 2 does not require a layer 60 to fix the orientation of the pinned magnetic layer 66. In another embodiment, the pinned magnetic layer 66 comprises a ferromagnetic material with high coercivity such that, in the presence of applied magnetic fields of magnitudes in a range sufficient to switch the free magnetic layer, the magnetic moment of this layer is essentially fixed by its intrinsic magnetic anisotropy.

As with the pinned magnetic layer 66, the free magnetic layer 64 is preferably also comprised of a soft ferromagnetic material, including, but not limited to, ferromagnetic materials such as cobalt, iron-cobalt, nickel iron, or nickel-iron-cobalt.

The free magnetic layer 64 is separated from the pinned magnetic layer 66 by a non-magnetic interlayer 62. When the material of the non-magnetic layer 62 is an insulator, the magneto-resistive memory cell 2 is a spin dependent tunneling device in which an electrical charge quantum mechanically tunnels through the tunnel barrier 62 when a read voltage is applied to the magneto-resistive memory cell 62. In this embodiment, the interlayer 62 is preferably comprised of an insulating material such as aluminum oxide. Preferably the insulating material has a thickness in the range of about 5 Å to 30 Å, more preferably about 8 Å to 15 Å, and most preferably about 10 Å to 12 Å.

In another embodiment, the non-magnetic interlayer 62 may be comprised of a conductor such as copper to take advantage of the giant magneto-resistive effect, where a read, or sense, current flows through the conductor of non-magnetic interlayer 62. Preferably the conductor has a thickness in the range of about 19 Å to 40 Å, more preferably about 20 Å to 28 Å, and most preferably about 22 Å to 24 Å.

The skilled artisan will recognize that because the preferred embodiments employ coupling at the end-portions of the free magnetic layer 64 and the pinned magnetic layer 66, the present invention does not depend upon a particular structure or arrangement of layers for memory cell 2. Thus, the present teachings do not layers in addition to the layers 64, 62, 66 and 60 shown in FIG. 8, nor whether above, below or to the sides of the structure shown in FIG. 8, so long as the above described coupling of the end-portions 34 and 38 is facilitated. In addition, while the proximity of each layer relative to other layers should be maintained, the present teachings do not limit the orientation of the stack of layers as a whole. For example, the stacks of FIG. 8 may be constructed on a substrate such that they appear upside down relative to the illustrated figure.

Figure 9:
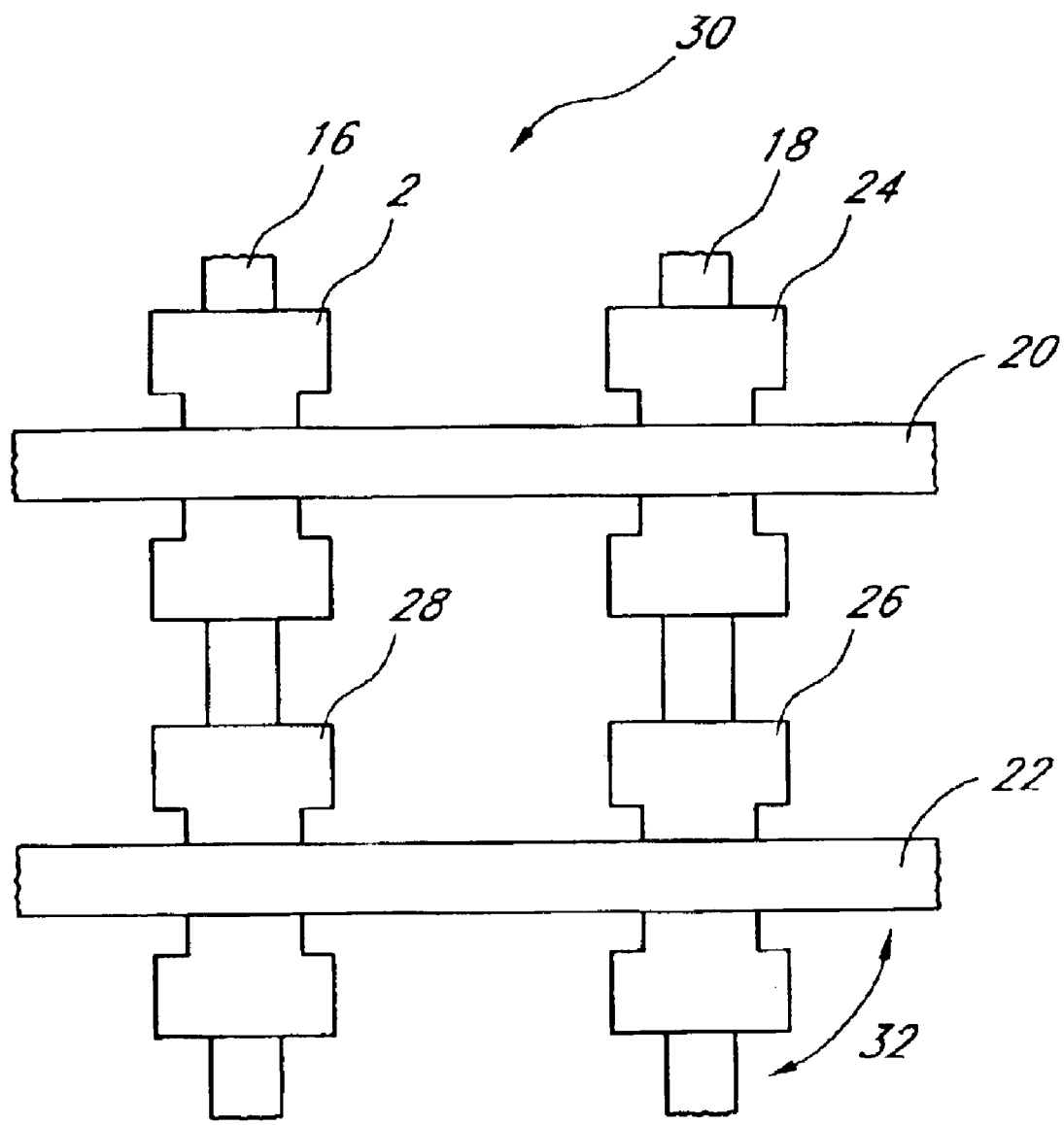
FIG. 9 is a schematic top view of a magneto-resistive memory array which incorporates memory cells constructed in accordance with the present teachings.

FIG. 9 is a top view of an illustrative magneto-resistive memory array 30 that incorporates the present teachings. The magneto-resistive memory array 30 includes an array of magneto-resistive memory cells, including the magneto-resistive memory cell 2 and additional magneto-resistive memory cells 24–28, each similarly made. Each magneto-resistive memory cell is located at the intersection of at least two conductors, one each from the sets of conductors, 16, 18 and 20, 22.

The sets of conductors allow reading from and writing to the magneto-resistive memory cells. In the illustrated embodiment, conductors 16 and 18 are perpendicular to conductors 20 and 22. In other embodiments, the angle 32 formed by conductors 16 and 18 with conductors 20 and 22 may vary so long as a magnetic-resistive memory cell 2 at the intersection of two conductors may be selected and the resistance state switched by a current flowing through the two conductors.

In addition, the present teachings do not depend on and, so, do not limit the relative sizes of the conductor lines 16–22 or the relative sizes of the magneto-resistive memory cells 2 and 24–28. Also, while magneto-resistive memory cells are typically connected to two conductors, and are illustrated as such, it will be appreciated that this figure only illustrates that, at a minimum, two conductors are necessary for writing to the memory cell. Additional conductors, e.g., an additional, separate conductor (sense line) to sense the resistance of the memory cell, are not illustrated but can be added.

Figure 10:
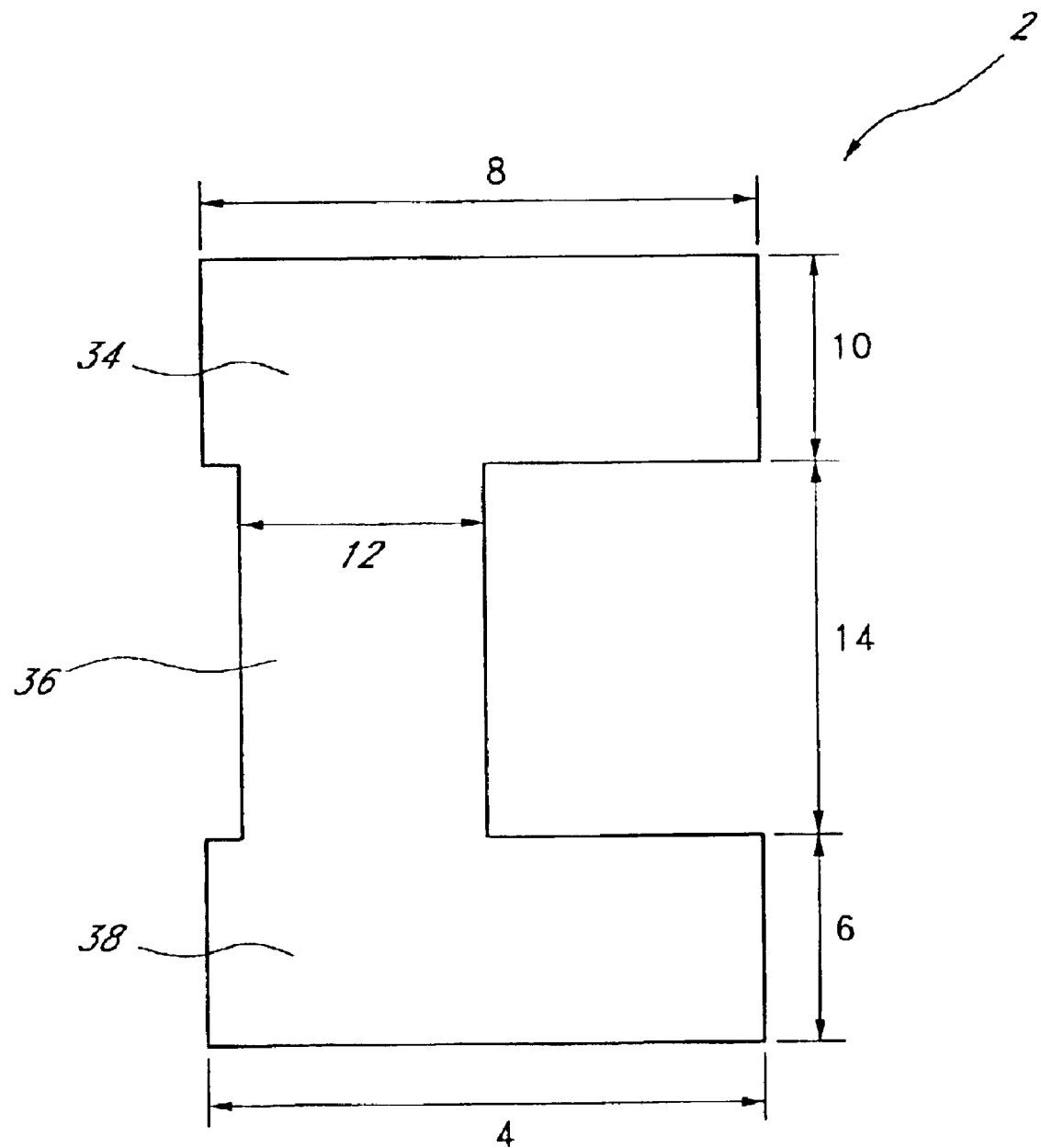
FIG. 10 is a schematic top-view of a memory cell in accordance with one illustration embodiment of the present invention.
Figure 11:
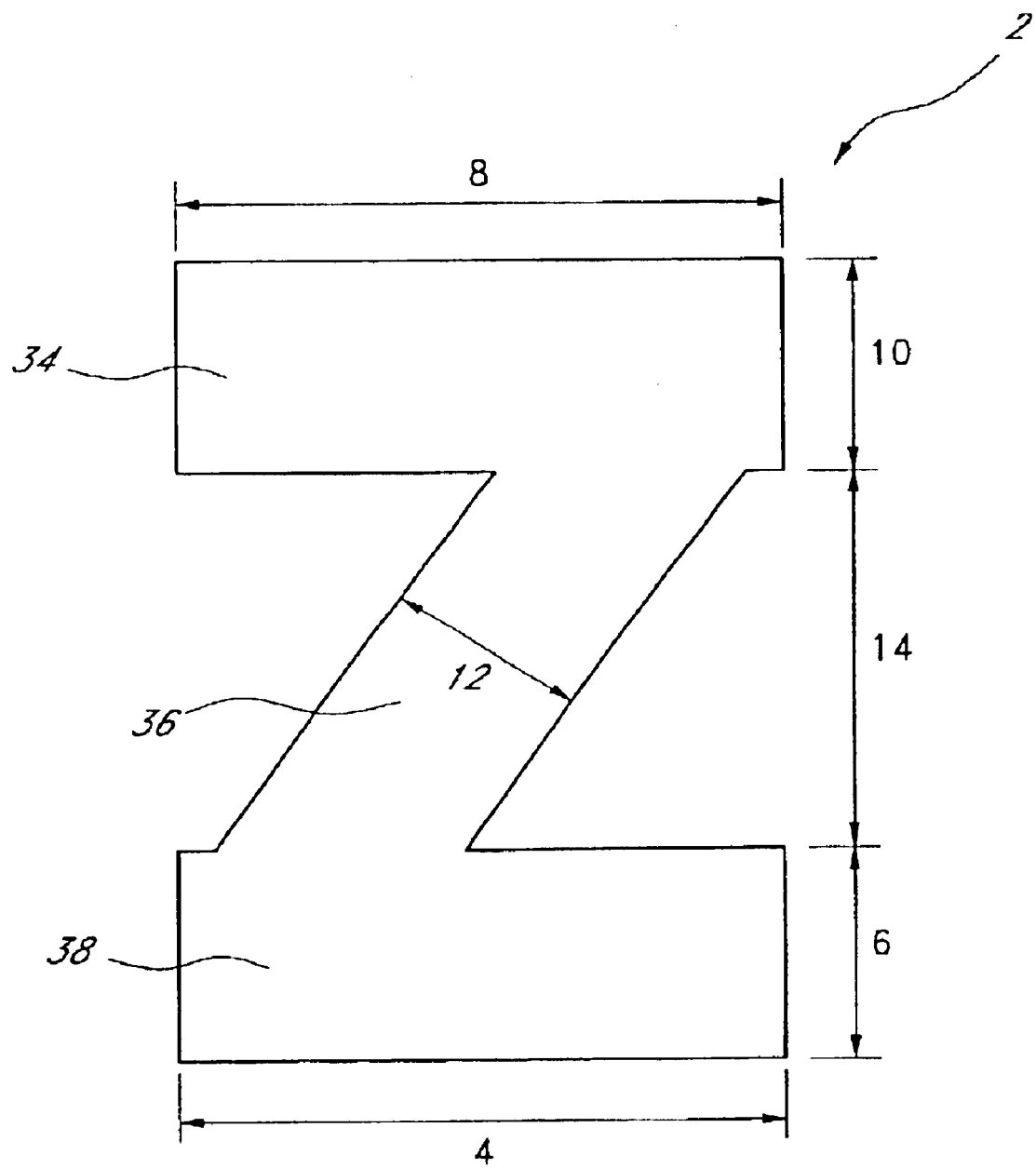
FIG. 11 is a schematic top-view of a memory cell in accordance with another illustrative embodiment of the present invention.

With respect to the magnetic-resistive memory cell 2, the skilled artisan will appreciate that, while preferred embodiments of the present invention have certain relationships between width 8 and length 10, width 12 and length 14, width 4 and lengths 6, and width 12 and width 4, these relationships require no specific orientation of the widened end-portions 34 and 38 with mid-portion 36. For example, with reference to FIG. 6, in the illustrated embodiment, the mid-portion 36 is perpendicular to and centered along the widths of the widened end-portions 34 and 38, which are equal in their dimensions. As such, the three portions form the preferred general shape of an I. While an I shape is preferred, in other embodiments, the widened end-portions 34 and 38 need not be perpendicular to the mid-portion 38. For example, each end-portion 34 or 38 may form angle 40 and 42 (FIG. 6) with the mid-portion 36 that is obtuse or acute. The mid-portion 36 also may be offset and not centered along the widths 8 or 4 of widened end-portions 34 or 38, as shown in FIGS. 10 and 11. Thus, in one embodiment, the magneto-resistive memory cell 2 may be in the general shape of a C, as judged from a top view and as shown in FIG. 10. Less preferably, the top view of magneto-resistive memory cell 2 shows a general Z shape, as shown in FIG. 11. Generally, however, the mid-portion 36 preferably does not extend fully to meet the shorter edges of the widened end-portions 34 and 38, as shown in FIGS. 10 and 11. For example, with respect to FIG. 10, the long edge of mid-portion 36 is preferably not flush with the short edges of end-portions 34 or 38.

Consequently, although this invention has been described in terms of a certain preferred embodiment and suggested possible modifications thereto, other embodiments and modifications that may suggest themselves or be apparent to those of ordinary skill in the art are also within the spirit and scope of this invention. Accordingly, the scope of this invention is intended to be defined by the claims that follow.

We claim:

1. A magneto-resistive memory cell comprising:
   a free magnetic layer, comprising:
   a first widened end-portion at a first end of the free magnetic layer; and a second widened end-portion at a second end of the free magnetic layer opposite to the first end of the free magnetic layer;

a pinned magnetic layer, comprising:

a third widened end-portion at a first end of the pinned magnetic layer; and a fourth widened end-portion at a second end of the pinned magnetic layer opposite to the first end of the pinned magnetic layer; and a non-magnetic interlayer, wherein the non-magnetic interlayer is between the pinned magnetic layer and the free magnetic layer and wherein a first minimum magnitude of an applied magnetic field for switching the magneto-resistive memory cell from a low resistance state to a high resistance state is about 80–120 percent of a second minimum magnitude of an applied magnetic field for switching the magneto-resistive memory cell from the high resistance state to the low resistance state and wherein a switching magnitude difference of the magneto-resistive memory cell is less than another switching magnitude difference of an identical magneto-resistive memory cell without widened end-portions.

2. The magneto-resistive memory cell of claim 1, wherein the first magnitude is substantially equal to the second magnitude.

3. The magneto-resistive memory cell of claim 1, wherein the first widened end-portion is directly above the third widened end-portion and wherein the second widened end-portion is directly above the fourth widened end-portion.

4. The magneto-resistive memory cell of claim 1, wherein a first length and a first width of the first widened end-portion is substantially equal to a second length and a second width of the second widened end-portion.

5. The magneto-resistive memory cell of claim 4, wherein a third length and a third width of the third widened end-portion is substantially equal to a fourth length and a fourth width of the fourth widened end-portion.

6. The magneto-resistive memory cell of claim 5, wherein the first length and the first width of the first widened end-portion is substantially equal to the third length and the third width of the third widened end-portion.

7. The magneto-resistive memory cell of claim 1, wherein the non-magnetic interlayer comprises a conductor.

8. The magneto-resistive memory cell of claim 7, wherein the conductor comprises copper.

9. The magneto-resistive memory cell of claim 7, wherein the non-magnetic interlayer has a thickness of about 19 to 40 Å.

10. The magneto-resistive memory cell of claim 9, wherein the non-magnetic interlayer has a thickness of about 20 to 28 Å.

11. The magneto-resistive memory cell of claim 10, wherein the non-magnetic interlayer has a thickness of about 22 to 24 Å.

12. The magneto-resistive memory cell of claim 1, wherein the non-magnetic interlayer comprises an insulator.

13. The magneto-resistive memory cell of claim 12, wherein the non-magnetic interlayer has a thickness of about 5 to 30 Å.

14. The magneto-resistive memory cell of claim 13, wherein the non-magnetic interlayer has a thickness of about 8 to 15 Å.

15. The magneto-resistive memory cell of claim 14, wherein the non-magnetic interlayer has a thickness of about 10 to 12 Å.

16. The magneto-resistive memory cell of claim 1, wherein a magnetization orientation of the pinned magnetic layer is pinned by an adjacent layer.

17. The magneto-resistive memory cell of claim 16, wherein the adjacent layer comprises an antiferromagnetic material.

18. The magneto-resistive memory cell of claim 16, wherein the adjacent layer comprises a permanent magnet material.

19. The magneto-resistive memory cell of claim 1, wherein the pinned magnetic layer comprises a permanent magnet.

20. The magneto-resistive memory cell of claim 1, wherein the pinned magnetic layer comprises a ferromagnetic material with coercivity sufficiently high such that its magnetization orientation remains fixed in the presence of an applied magnetic field of a magnitude sufficient to switch the magnetization orientation of the free magnetic layer.

21. A magneto-resistive memory cell comprising:

a mid-segment;

a first end-segment abutting the mid-segment; and a second end-segment abutting the mid-segment on a side opposite to a side abutted by the first end segment;

wherein a first width and a first length of the first end-segment and a second width and a second length of the second end-segment are chosen so that a first minimum magnitude of an applied magnetic field for switching the magneto-resistive memory cell to a high resistance state is about 80–120 percent of a second minimum magnitude of an applied magnetic field for switching the magneto-resistive memory cell to a low resistance state.

22. The magneto-resistive memory cell of claim 21, wherein a first switching magnitude difference for the magneto-resistive memory cell is less than a second switching magnitude difference for an identical magneto-resistive memory cell having a substantially rectangular shape.

23. The magneto-resistive memory cell of claim 21, wherein the first magnitude of an applied magnetic field is about 90–110 percent of the second magnitude of an applied magnetic field.

24. The magneto-resistive memory cell of claim 23, wherein the first magnitude of an applied magnetic field is substantially equal to the second magnitude of an applied magnetic field.

25. The magneto-resistive memory cell of claim 24, wherein the first length is substantially equal to the second length.

26. The magneto-resistive memory cell of claim 21, wherein the first width is substantially equal to the second width.

27. The magneto-resistive memory cell of claim 21, wherein the first width is at least about 1.5 times greater than the first length.

28. The magneto-resistive memory cell of claim 27, wherein the second width is at least about 1.5 times greater than the second length.

29. The magneto-resistive memory cell of claim 21, wherein a first shape of the first end-segment and a second shape of the second end-segment are substantially rectangular.

30. The magneto-resistive memory cell of claim 29, wherein all sides of the first and second shapes are substantially straight.

31. The magneto-resistive memory cell of claim 30, wherein the first end-segment and the second end-segment are substantially parallel.

32. The magneto-resistive memory cell of claim 31, wherein the first end-segment and the second end-segment are substantially perpendicular to the mid-segment.

33. The magneto-resistive memory cell of claim 32, wherein the mid-segment is substantially centered along the length of both the first end-segment and the second end-segment.

34. A magneto-resistive memory cell, comprising:
- a mid-portion having a first length and a first width, wherein the first width is measured at the mid-point of the first length and wherein a first ratio of the first length to the first width is at least about 1.5:1;
- a first end-portion, wherein the first end-portion abuts the mid-portion and extends along the first width of the mid-portion and wherein the first end-portion has a second length and a second width, wherein a second ratio of the second length to the second width is at least about 1.5 and wherein a third ratio of the first width to the second width is at least about 1.5; and
- a second end-portion, wherein the second end-portion abuts a side of the mid-portion opposite to a side abutted by the first end-portion, wherein the second end-portion has a third width and a third length, wherein a fourth ratio of the third length to the third width is at least about 1.5 and wherein a fifth ratio of the first width to the third width is at least about 1.5.

35. The magneto-resistive memory cell of claim 34, wherein a first magnitude of an applied magnetic field for switching the memory cell from a low resistance state to a high resistance state is about 80–120 percent of a second magnitude of an applied magnetic field for switching the magneto-resistive memory cell from the high resistance state to the low resistance state.

36. The magneto-resistive memory cell of claim 35, wherein the first magnitude is about 90–110 percent of the second magnitude.

37. The magneto-resistive memory cell of claim 36, wherein the first magnitude is substantially equal to the second magnitude.

38. The magneto-resistive memory cell of claim 34, wherein the first end-portion is perpendicular to the mid-portion.

39. The magneto-resistive memory cell of claim 38, wherein the second end-portion is perpendicular to the mid-portion.

40. The magneto-resistive memory cell of claim 34, wherein the mid-portion is centered along the second length of the first end-portion.

41. The magneto-resistive memory cell of claim 40, wherein the mid-portion is centered along the third length of the second end-portion.

42. The magneto-resistive memory cell of claim 34, wherein a first shape of the first end-portion and a second shape the second end-portion are substantially rectangular.

43. The magneto-resistive memory cell of claim 34, wherein the first ratio is at least about 3:1.

44. The magneto-resistive memory cell of claim 43, wherein the second ratio is at least about 2:1.

45. The magneto-resistive memory cell of claim 44, wherein the third ratio is at least about 2:1.

46. The magneto-resistive memory cell of claim 45, wherein the fourth ratio is at least about 2:1.

47. The magneto-resistive memory cell of claim 46, wherein the fifth ratio is at least about 2:1.

* * * * *

UNITED STATES PATENT AND TRADEMARK OFFICE
CERTIFICATE OF CORRECTION

PATENT NO. : 6,765,823 B1
DATED : July 20, 2004
INVENTOR(S) : Zhu et al.

It is certified that error appears in the above-identified patent and that said Letters Patent is hereby corrected as shown below:

Column 1,
Line 15, please delete "arc" and replace with -- are --.

Column 3,
Line 1, after "two" please insert -- end --.
Line 20, after "and" please insert -- the --.
Line 24, please delete "from" and replace with -- form --.
Line 29, please delete "portion" and replace with -- portions --.
Line 30, pleae delete "embodiment" and replace with -- embodiments --.
Lines 46 and 58, please delete "illustration" and replace with -- illustrative --.

Column 4,
Line 3, please delete "predicable" and replace with -- predictable --.
Line 16, please delete "principals" and replace with -- principles --.
Line 19, please delete "cell" and replace with -- cells --.
Line 27, please delete "long" and replace with -- along --.
Line 54, please delete "assymetries" and replace with -- asymmetries --.

Column 5,
Line 4, please delete "anistropy" and replace with -- anisotropy --.
Line 15, please delete "anti-parrallel" and replace with -- anti-parallel --.

Column 7,
Line 24, after "embodiment" please insert -- , --.
Line 31, please delete "preferrably" and replace with -- preferably --.
Line 60, please delete "repectively" and replace with -- respectively --.

Column 8,
Lines 24-25, please delete "magnetization oriention" and replace with -- magnetization orientation --.
Line 27, please delete "about" before "1.5 times".
Line 61, please delete "invetion" and replace with -- invention --.

Column 9,
Line 12, after "permanent" please delete ".".

Column 12,
Line 23, please delete "end segment" and replace with -- end-segment --.

UNITED STATES PATENT AND TRADEMARK OFFICE
CERTIFICATE OF CORRECTION

PATENT NO.   : 6,765,823 B1
DATED        : July 20, 2004
INVENTOR(S)  : Zhu et al.

It is certified that error appears in the above-identified patent and that said Letters Patent is hereby corrected as shown below:

Column 14,
Line 22, after "shape" please insert -- of --.

Signed and Sealed this

First Day of November, 2005

JON W. DUDAS
*Director of the United States Patent and Trademark Office*